United States Patent [19]

Higuchi

[11] Patent Number: 5,027,070
[45] Date of Patent: Jun. 25, 1991

[54] MR IMAGING SYSTEM AND METHOD

[75] Inventor: Kazutoshi Higuchi, Katsuta, Japan

[73] Assignee: Hitachi, Ltd., Tokyo, Japan

[21] Appl. No.: 452,364

[22] Filed: Dec. 19, 1989

[30] Foreign Application Priority Data

Dec. 20, 1988 [JP] Japan ............... 63-321487

[51] Int. Cl.⁵ ........................... G01R 33/20
[52] U.S. Cl. ..................... 324/309; 128/653 A
[58] Field of Search ............ 324/300, 307, 309, 303, 324/308, 310, 311, 312, 313, 314, 318, 322; 128/653 A

[56] References Cited

U.S. PATENT DOCUMENTS

| | | | |
|---|---|---|---|
| 4,691,163 | 9/1987 | Blass | 324/309 |
| 4,812,753 | 3/1989 | Fuderer | 324/307 |
| 4,812,761 | 3/1989 | Vaughan | 324/307 |
| 4,943,775 | 7/1990 | Boskamp | 324/322 |
| 4,947,121 | 8/1990 | Hayes | 324/318 |

Primary Examiner—Michael J. Tokar
Attorney, Agent, or Firm—Antonelli, Terry, Stout & Kraus

[57] ABSTRACT

In an MR imaging system and method using a surface coil, the intensity of a high frequency magnetic field providing a magnetic resonance signal of the maximum intensity for each of distances from a coil plane of the surface coil to planes to be imaged is determined and stored. When a distance from the coil plane of the surface coil to a desired plate to be imaged is set, data of the high frequency magnetic field stored corresponding to the set distance is read and the intensity of a high frequency magnetic field to be applied is determined on the basis of the read data.

6 Claims, 3 Drawing Sheets

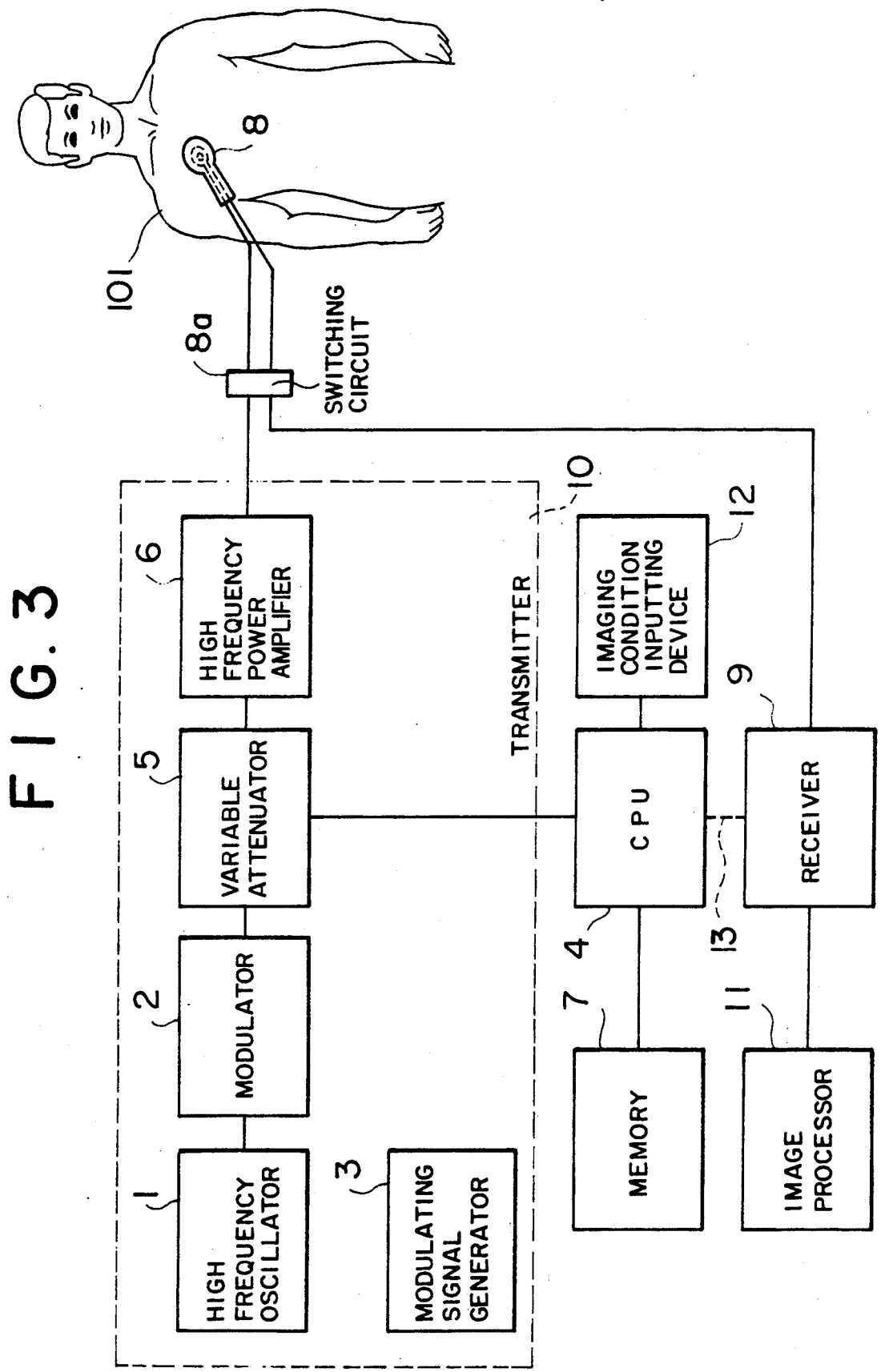

MR IMAGING SYSTEM AND METHOD

BACKGROUND OF THE INVENTION

The present invention relates to an MR (magnetic resonance) imaging system and method, and more particularly to an MR imaging system and method using a surface coil.

An MR imaging system is known as a medical apparatus for acquiring a cross-sectional image of an object to be examined such as a human body. However, there may be the case where the acquisition of a tomographic image of a local portion of the object in an arbitrary direction is desired without the need of the cross-sectional image of the object. A surface coil has been proposed in order to satisfy such a requirement. The surface coil is used together with three-dimensional orthogonal field gradient coils incorporated into an MR imaging system and serves to generate a high frequency or RF magnetic field and to detect a magnetic resonance signal. The surface coil is used in contact with a local portion of an object to be examined a tomographic image of which is to be acquired.

When a high frequency magnetic field having a predetermined intensity is generated by use of the surface coil, the intensity of a magnetic resonance signal changes in accordance with a distance from a surface of the object to be examined since the flip angle of nuclear spins is different depending on the distance from the surface of the object to be examined. Accordingly, in the case where it is desired to acquire a tomographic image of a plane parallel to a coil plane of the surface coil, a magnetic resonance signal can be detected with the maximum intensity by optimizing a high frequency magnetic field generating signal to be inputted to the surface coil. In the prior art, however, no sufficient consideration is paid to such an aspect. Even if any consideration is involved, there is a problem that the construction becomes complicated, for example, an additional surface coil is required (see JP-A-62-26053).

SUMMARY OF THE INVENTION

An object of the present invention made in view of the above-mentioned circumstances is to provide an MR imaging system and method in which in making a tomographic image of an object to be examined in a plane parallel to the coil plane of a surface coil, the best image can be acquired with a simple construction by optimizing the intensity of a high frequency magnetic field in accordance with a distance between the coil plane of the surface coil and the plane to be imaged so that a magnetic resonance signal is always detected with the maximum intensity.

To achieve the above object, in the present invention, data of the intensity of a high frequency magnetic field providing a magnetic resonance signal of the maximum intensity for each of distances between the coil plane of a surface coil and planes to be imaged parallel to the coil plane is stored. Upon actual imaging, a distance from the coil plane of the surface coil to a desired plane to be imaged is set and a high frequency magnetic field intensity input signal to be applied to the surface coil is determined on the basis of data of the high frequency magnetic field intensity stored corresponding to the set distance so that an optimum high frequency magnetic field is generated.

BRIEF DESCRIPTION OF THE DRAWINGS

FIG. 3 is a block diagram of an MR imaging system according to an embodiment of the present invention.

DESCRIPTION OF THE PREFERRED EMBODIMENTS

The principle of the present invention will now be explained by use of FIG. 1.

When a high frequency magnetic field intensity signal having a predetermined amplitude is applied to a surface coil 8, the flip angle of nuclear spins in an object 101 to be examined is different depending on a distance from the surface coil 8. An example thereof is shown in FIG. 1 in conjunction with the cases of distances of $d_1$ to $d_4$. At the distance $d_1$, the intensity of a high frequency magnetic field is large so that the nuclear spins are tilted at an angle greater than 90°. At the distance $d_2$, the high frequency magnetic field intensity is optimum so that the nuclear spins are tilted at an angle of 90°. At the distance $d_3$ and $d_4$, the high frequency magnetic field intensity is weak so that the nuclear spins are tilted at an angle smaller than 90°. The intensity of a magnetic resonance signal detected is proportional to the cosine ($\cos\theta$) of the flip angle $\theta$ of nuclear spins. Therefore, when the flip angle of nuclear spins is 90°, the magnetic resonance signal can be detected with the maximum intensity. A peak point of the resonance signal intensity detected moves toward a direction of arrow 102 if the high frequency magnetic field intensity is reduced and moves toward a direction of arrow 103 if the high frequency magnetic field intensity is increased. Thus, the intensity of a high frequency magnetic field which provides a resonance signal of the maximum intensity (or optimizes the resonance signal intensity) exists for each of distances from the coil plane of the surface coil to planes to be imaged. Upon actual imaging, a relation between the distance from the coil plane of the surface coil to a desired plane to be imaged and the optimum value of the high frequency magnetic field intensity is utilized to detect a resonance signal with the maximum intensity, thereby acquiring a tomographic image.

Figure 1:
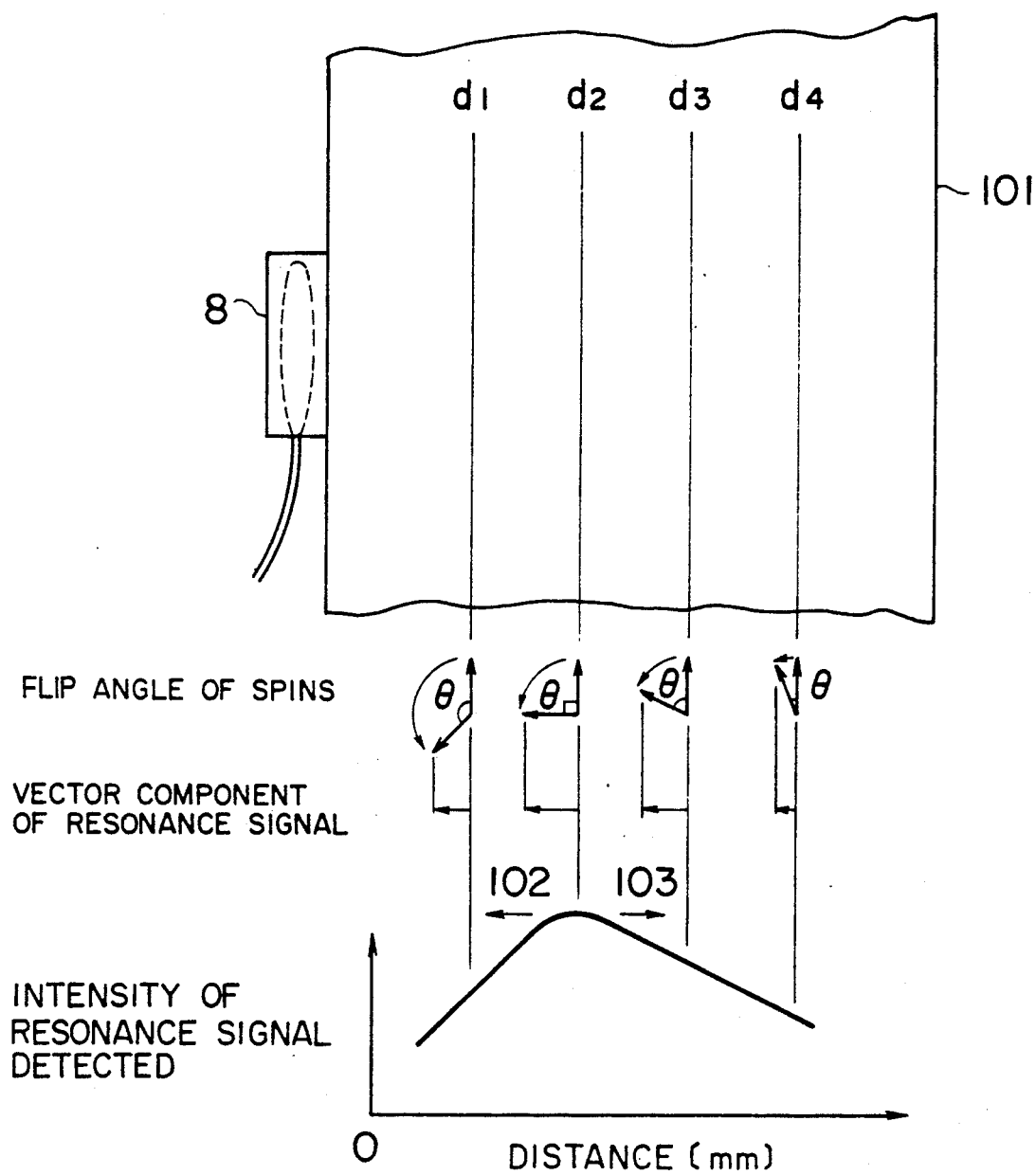
FIG. 1 is a view for explaining the principle of the present invention.
Figure 2:
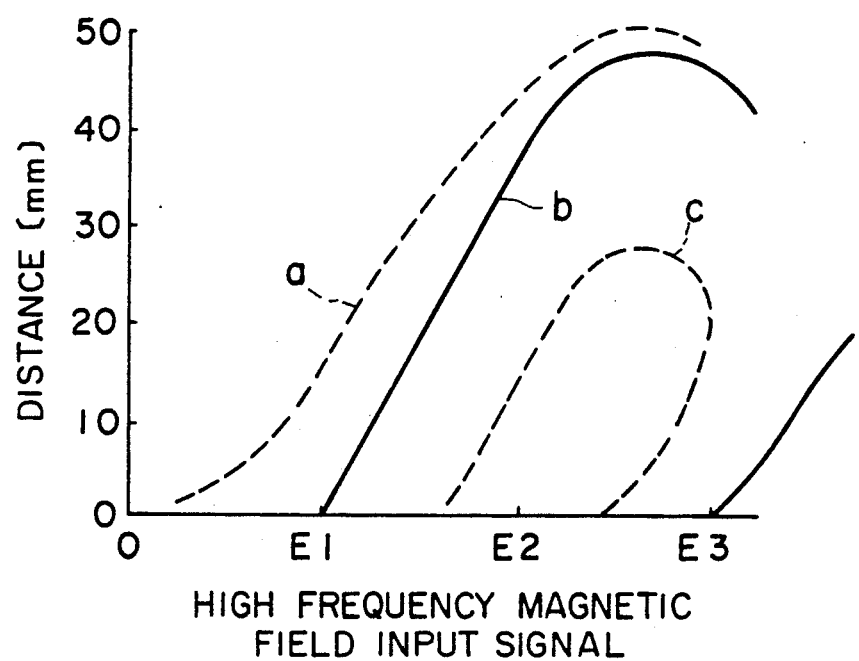
FIG. 2 is a graph showing the intensity of a detected magnetic resonance signal in relation to a distance to a plane to be imaged and the intensity of a high frequency magnetic field.

A peak point of the intensity of a detected resonance signal as shown in FIG. 1 and a point giving an intensity which is a half of that at the peak point have been measured while changing the intensity of a high frequency magnetic field applied. The results of measurement are shown in FIG. 2. The ordinate of FIG. 2 represents a distance between the coil plane of a surface coil and a plane to be imaged parallel to the coil plane and the abscissa thereof represents a high frequency magnetic field intensity signal inputted to the surface coil. Broken curve a shows points where the nuclear spins are tilted at an angle of 45°, solid curve b shows points where the nuclear spins are tilted at an angle of 90° and broken curve c shows points where the nuclear spins are tilted at an angle of 135°. The measurement has been made by use of a surface coil having a diameter of 80 mm and in accordance with a spin-echo method in which the nuclear spins are tilted at an angle of 90° by virtue of a high frequency magnetic field and they are thereafter tilted at an angle of 180°. First, a homogeneous substance (for example, water) is prepared as an object to be measured and the intensity of a high frequency magnetic field for the object to be measured is set to a predetermined value (lower than a usual value) to detect the intensity of a magnetic resonance signal in a direction perpendicular to the coil plane of the surface coil. The intensity of the high frequency magnetic field is gradually increased to measure magnetic resonance signals, thereby obtaining the graph shown in FIG. 2.

In a first embodiment of the present invention, a relation between the ordinate and abscissa of the curve b in FIG. 2 is stored. When a distance from a surface of an object to be examined (or the coil plane at a surface coil) to a desired plane to be imaged is set, data of the high frequency magnetic field intensity corresponding to the set distance is read so that a high frequency magnetic field intensity signal to be inputted to the surface coil is controlled on the basis of the read data.

FIG. 1 shows a block diagram of an MR imaging system according to the first embodiment of the present invention. A high frequency signal from a high frequency oscillator 1 is inputted to a modulator 2. The output of a modulating signal generator 3 is also inputted to the modulator 2 so that the pulse amplitude of a magnetic resonance signal is modulated by the output waveform of the modulating signal generator 3. The amplitude-modulated signal is inputted to a variable attenuator 5 the output of which is inputted to a surface coil 8 through a high frequency power amplifier 6. The high frequency oscillator 1, the modulator 2, the modulating signal generator 3, the variable attenuator 5 and the high frequency power amplifier 6 constitutes a transmitter 10.

An output of the variable attenuator 5 can be changed by an output from a CPU 4. When a distance from a coil plane of the surface coil 8 to a desired plane to be imaged is set by an imaging condition inputting device 12, data of the intensity of a high frequency magnetic field causing the generation of a magnetic resonance signal with the maximum intensity at the set distance is read from a memory 7 by the CPU 4 which in turn controls the variable attenuator 5 on the basis of the read data.

The surface coil 8 serves as both a transmitter coil and a receiver coil. More particularly, a switching circuit 8a is provided on input and output sides of the surface coil 8 so that a received signal is inputted to an image processor 11 through a receiver 9 after a predetermined time from the inputting of the output signal of the high frequency power amplifier 6 to the surface coil 8.

In the above embodiment, the variable attenuator 5 has been provided in rear of the modulator 2. Alternatively, the variable attenuator may be provided in front of the modulator 2 to adjust the amplitude of an output carrier wave of the high frequency oscillator 1 or the amplitude of a modulation wave of the modulating signal generator 3. In either case, an effect similar to that in the present embodiment can be obtained.

Next, a second embodiment of the present invention will be explained.

The second embodiment does not a method of preliminarily storing data of the optimum high frequency magnetic field intensity for each of distances to the coil plane of the surface coil 8 to planes to be imaged. There-instead, when a distance from the coil plane of the surface coil 8 to a desired plane to be imaged is set, a high frequency magnetic field is tentatively applied with a gradually changed intensity thereof to an object 101 to be examined under the set distance to determine the intensity of a high frequency magnetic field which provides a magnetic resonance signal having the maximum intensity. In that case, signals from the receiver 9 are inputted to the CPU 4 through a line 13 (shown by dotted line in FIG. 3) so that the intensities of detected magnetic resonance signals are compared with each other to determine the optimum high frequency magnetic field intensity which provides the maximum magnetic resonance signal intensity. The determined optimum high frequency magnetic field intensity is stored and the variable attenuator 5 is controlled upon actual imaging on the basis of the stored data.

I claim:

1. An MR imaging system comprising:
   (a) a surface coil for applying a high frequency magnetic field to an object to be examined and detecting a magnetic resonance signal therefrom;
   (b) transmitting means for transmitting a signal for generation of the high frequency magnetic field to said surface coil;
   (c) storing means for storing the intensity of a high frequency magnetic field providing a magnetic resonance signal of the maximum intensity for each of distances from a coil plane of said surface coil to planes to be imaged;
   (d) reading means in response to setting of a distance from the coil plane of said surface coil to a desired plane to be imaged for reading data of the high frequency magnetic field intensity corresponding to the set distance from said storing means; and
   (e) controlling means for controlling said transmitting means on the basis of the read data.

2. An MR imaging system according to claim 1, wherein said transmitting means includes a high frequency oscillator, a modulator, a modulating signal generator, a variable attenuator and a high frequency power amplifier, and said controlling means includes means for controlling said variable attenuator.

3. An MR imaging system comprising:
   (a) a surface coil for applying a high frequency magnetic field to an object to be examined and detecting a magnetic resonance signal therefrom;
   (b) transmitting means for transmitting a signal for generation of the high frequency magnetic field to said surface coil;
   (c) setting means for setting a distance from a coil plane of said surface coil to a desired plane to be imaged;
   (d) comparing means for comparing the intensities of the magnetic resonance signals detected under the set distance with the intensity of the high frequency magnetic field being changed;
   (e) determining means for determining from the comparison the intensity of a high frequency magnetic field which provides a magnetic resonance signal of the maximum intensity; and
   (f) controlling means for controlling said transmitting means so that a high frequency magnetic field having the determined intensity is applied to said object to be examined.

4. An MR imaging system according to claim 3, wherein said transmitting means includes a high frequency oscillator, a modulator, a modulating signal generator, a variable attenuator and a high frequency power amplifier, and said controlling means includes means for controlling said variable attenuator.

5. An MR imaging method comprising:
   (a) a step of storing in a memory the intensity of a high frequency magnetic field providing a magnetic resonance signal of the maximum intensity for each of distances from the coil plane of a surface coil to planes to be imaged;
   (b) a step of reading, upon setting of a distance from the coil plane of said surface coil to a desired plane to be imaged, data of the high frequency magnetic field intensity stored corresponding to the set distance from said memory; and
   (c) a step of controlling the intensity of a high frequency magnetic field applied from said surface coil on the basis of the read data.

6. An MR imaging method comprising:
   (a) a step of setting a distance from the coil plane of a surface coil to a desired plane to be imaged;
   (b) a step of comparing the intensities of magnetic resonance signals detected under the set distance with the intensity of a high frequency magnetic field being changed;
   (c) a step of determining from the comparison the intensity of a high frequency magnetic field which provides a magnetic resonance signal of the maximum intensity; and
   (d) a step of applying a high frequency magnetic field having the determined intensity from said surface coil to carry out imaging.

* * * * *